(12) United States Patent
Camarena et al.

(10) Patent No.: US 8,638,135 B2
(45) Date of Patent: Jan. 28, 2014

(54) INTEGRATED CIRCUIT HAVING LATCH-UP RECOVERY CIRCUIT

(75) Inventors: Jose A. Camarena, Austin, TX (US); Dale J. McQuirk, Austin, TX (US); Miten H. Nagda, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 15 days.

(21) Appl. No.: 13/272,542

(22) Filed: Oct. 13, 2011

(65) Prior Publication Data

US 2013/0093486 A1    Apr. 18, 2013

(51) Int. Cl.
*H03L 7/00* (2006.01)

(52) U.S. Cl.
USPC .............................. 327/142; 327/143; 327/198

(58) Field of Classification Search
USPC .......................................... 327/142, 143, 198
See application file for complete search history.

(56) References Cited

U.S. PATENT DOCUMENTS

| | | | |
|---|---|---|---|
| 4,594,633 A | | 6/1986 | Townsend et al. |
| 4,820,936 A | * | 4/1989 | Veendrick et al. ............. 327/534 |
| 5,140,177 A | * | 8/1992 | Suda et al. ...................... 326/21 |
| 5,212,616 A | | 5/1993 | Dhong et al. |
| 5,389,842 A | * | 2/1995 | Hardee ........................... 327/391 |
| 5,513,358 A | * | 4/1996 | Lundberg et al. .............. 713/330 |
| 6,744,291 B2 | * | 6/2004 | Payne et al. .................... 327/143 |
| 7,212,046 B2 | * | 5/2007 | Hur ................................. 327/143 |
| 7,355,437 B2 | | 4/2008 | Perisetty |
| 7,576,575 B2 | * | 8/2009 | Won et al. ...................... 327/143 |
| 7,773,442 B2 | | 8/2010 | Kapre et al. |
| 2003/0042946 A1 | * | 3/2003 | Chen et al. ..................... 327/143 |
| 2004/0212408 A1 | * | 10/2004 | Indoh ............................. 327/143 |
| 2005/0093590 A1 | * | 5/2005 | Jang .............................. 327/143 |
| 2006/0170466 A1 | * | 8/2006 | Park .............................. 327/143 |
| 2007/0268044 A1 | * | 11/2007 | Pan et al. ........................ 326/83 |
| 2011/0102037 A1 | * | 5/2011 | Cheng et al. .................. 327/161 |

* cited by examiner

*Primary Examiner* — Lincoln Donovan
*Assistant Examiner* — Brandon S Cole
(74) *Attorney, Agent, or Firm* — Dan D. Hill

(57) ABSTRACT

An integrated circuit includes first and second transistors, a switch, and a power-on reset (POR) circuit. The first transistor has a first current electrode, a second current electrode, and a control electrode. The second transistor has a first current electrode coupled to the second current electrode of the first transistor, a second current electrode, and a control electrode. The switch is for coupling the first and second transistors to receive a power supply voltage in response to an asserted bias control signal. The POR circuit has a latch-up detection circuit coupled to receive the power supply voltage and to a control terminal of the switch. The latch-up detection circuit is for detecting a low voltage condition of the power supply voltage, and in response, deasserting the bias control signal to decouple the first and second transistors from the power supply voltage.

20 Claims, 4 Drawing Sheets

INTEGRATED CIRCUIT HAVING LATCH-UP RECOVERY CIRCUIT

BACKGROUND

1. Field

This disclosure relates generally to integrated circuits, and more specifically, to an integrated circuit having a latch-up recovery circuit.

2. Related Art

The problem of "latch-up" in CMOS integrated circuits is well known. Latch-up is a condition caused by parasitic devices inherent in CMOS circuits that cause the CMOS circuit to enter a high current state. When the latch-up condition is entered, the CMOS circuit may remain in latch-up until power is removed. The high current can cause irreversible damage to the integrated circuit. The latch-up problem becomes greater as device geometries and circuit dimensions are scaled down.

Therefore, what is needed is a circuit that solves the above problems.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 1:
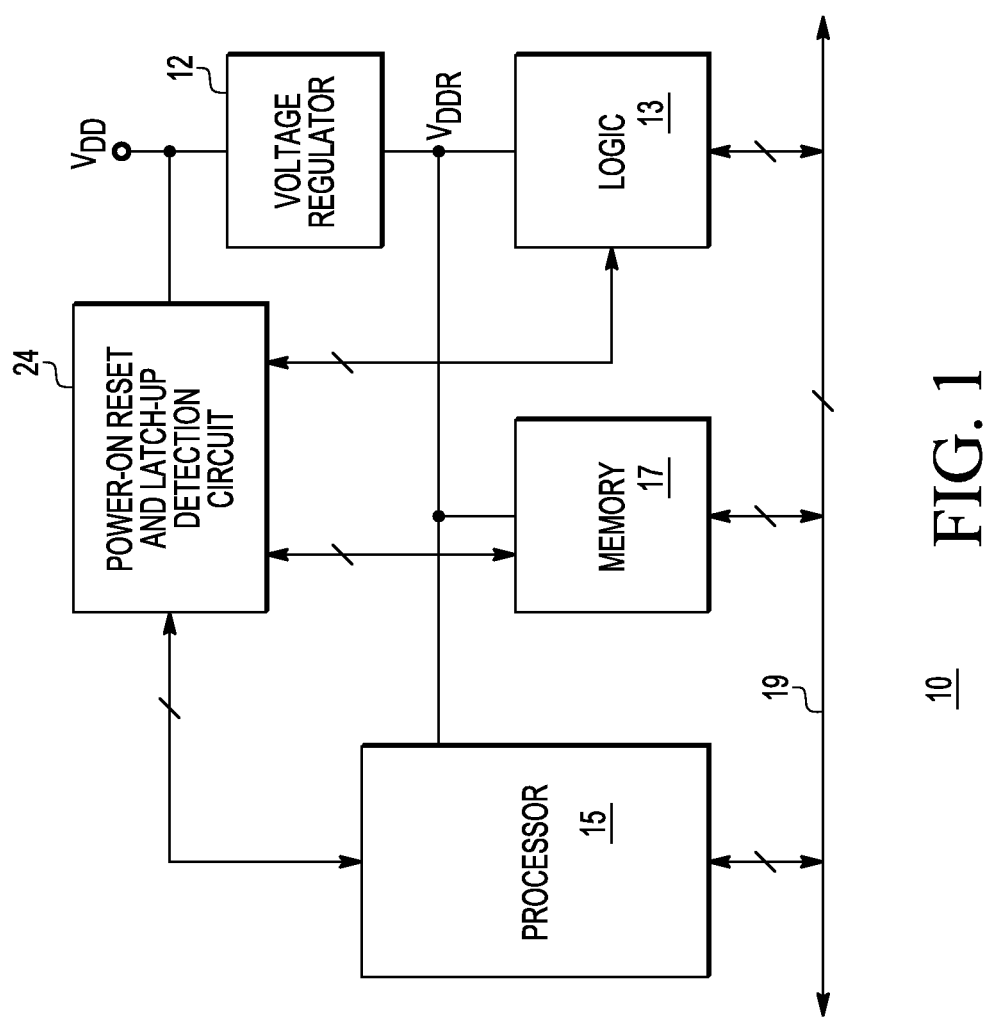
FIG. 1 illustrates, in block diagram form, an integrated circuit in accordance with an embodiment.

Generally, there is provided, an integrated circuit having a latch-up detection circuit that detects and corrects a latch-up condition in the integrated circuit. Circuits susceptible to latch-up include logic gates and various memory circuits. In one embodiment, a first switch is coupled between a positive power supply terminal and the logic gate and a second switch is coupled between a ground terminal and the logic gate. Gate electrodes of the first and second switches are coupled to a power-on reset circuit having a latch-up detection circuit. The latch-up detection circuit monitors a power supply voltage to, for example, a plurality of logic gates that are susceptible to the latch-up condition. If the power supply voltage to the plurality of logic gates drops below a predetermined threshold voltage, the latch-up detection circuit initiates a power-on reset (POR) in the integrated circuit. In addition to the normal POR sequence, the POR includes disconnecting the plurality of logic gates from one of the power supply voltage terminals by opening a predetermined one or both of the first or second switches. In one embodiment, the power supply voltage terminal is coupled to ground. In another embodiment, the power supply voltage terminal is coupled to receive a positive power supply voltage from a voltage regulator. The latch-up detection circuit uses the existing POR circuit to recover from the latch-up condition by disconnecting the circuit in latch-up from the power supply. By disconnecting the circuits from the power supply voltage when a latch-up condition is detected, irreversible damage to the integrated circuit is prevented.

As used herein the term metal-oxide-semiconductor and the abbreviation MOS are to be interpreted broadly, in particular, it should be understood that they are not limited merely to structures that use "metal" and "oxide" but may employ any type of conductor including "metal" and any type of dielectric including "oxide".

As used herein, the term "bus" is used to refer to a plurality of signals or conductors which may be used to transfer one or more various types of information, such as data, addresses, control, or status. The conductors as discussed herein may be illustrated or described in reference to being a single conductor, a plurality of conductors, unidirectional conductors, or bidirectional conductors. However, different embodiments may vary the implementation of the conductors. For example, separate unidirectional conductors may be used rather than bidirectional conductors and vice versa. Also, plurality of conductors may be replaced with a single conductor that transfers multiple signals serially or in a time multiplexed manner. Likewise, single conductors carrying multiple signals may be separated out into various different conductors carrying subsets of these signals. Therefore, many options exist for transferring signals.

The terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

FIG. 1 illustrates, in block diagram form, integrated circuit 10 in accordance with an embodiment. Integrated circuit 10 includes voltage regulator 12, logic block 13, processor 15, memory block 17, and power-on reset and latch detection circuit 24. Processor 15, memory 17, and logic 13 are all bi-directionally connected to a bus 19. Bus 19 includes a plurality of conductors for bi-directionally transmitting address, instruction, data, and control information between the various circuit blocks of integrated circuit 10. The system of FIG. 1 is highly simplified for clarity and ease of illustration. Processor 15 can be any type of data processing block for processing instructions and/or data, such as for example, a central processing unit (CPU), microprocessor, microcontroller, digital signal processor (DSP), and the like. Also, an integrated circuit may have more than one processor. Memory 17 includes a memory array of volatile or non-volatile memory cells, such as for example, static random access memory (SRAM), dynamic random access memory (DRAM), electrically erasable programmable read only memory (EEPROM), read only memory (ROM), flash, and the like. In another embodiment, integrated circuit 10 may include more than one memory block. Logic block 13 includes a plurality of combinational logic gates for performing one or more predetermined logical functions. The plurality of logic gates may include such functions as, for example, AND, NAND, OR, NOR, exclusive OR, exclusive NOR, and inversion logic functions, to name a few. Logic block 13 may be closely associated with processor 15, and in some embodiments, may be considered to be a part of processor 15.

There are many voltage regulation schemes that can be used with integrated circuits depending on the application. One simplified power supply regulation scheme is illustrated in FIG. 1. In the embodiment of FIG. 1, one voltage regulator 12 receives an external power supply voltage labeled "VDD" and provides a regulated power supply voltage labeled "VDDR" to processor 15, memory 17, and logic 13. In another embodiment, there may be multiple voltage regulators supplying different voltage levels. Alternately, there may be no voltage regulators on integrated circuit 10 and the supply voltage used by the circuit blocks may be provided from a source external to the integrated circuit.

Power-on reset (POR) and latch-up detection circuit 24 has an input terminal coupled to receive power supply voltage VDD. POR and latch-up detection circuit 24 uses VDD as its power supply voltage and also monitors the level of VDD for an indication of latch-up in integrated circuit 10. Generally, a latch-up condition is possible in logic block 13, processor 15, or memory 17 where a P-channel transistor is connected in series with an N-channel transistor. As is well known in the art, parasitic devices in the P-channel and N-channel transistors can function as a silicon controlled rectifier (SCR) causing the latch-up condition. The susceptibility to latch-up increases as the lateral distance between the series-connected P-channel transistor and N-channel transistor decreases. Also, the possibility of a latch-up event may be a problem in some memory types that may be used in block 17, such as for example, an SRAM. Typically, latch-up results in a large current though the series-connected P-channel and N-channel transistors. The large current will cause the power supply voltage to drop significantly. The large latch-up current can irreversibly damage integrated circuit 10.

Power-on reset and latch-up detection circuit 24 includes a conventional power-on reset circuit for performing a POR sequence in response to a command from processor 15 or in response to the occurrence of a predetermined event or condition. At startup, or during reset, the POR circuit will hold the circuit blocks of integrated circuit 10 in a reset condition until the power supply voltage is in a predetermined voltage range. This allows the integrated circuit to start up in a safe predetermined state. In response to detecting a latch-up condition, power-on reset and latch-up detection circuit 24 will also remove the power supply voltage from the circuits that are in latch-up in addition to running the conventional power-on reset sequence. Removing the power supply voltage from the circuits that are detected to be in latch-up resolves the latch-up event before damage to the integrated circuit can occur.

Figure 2:
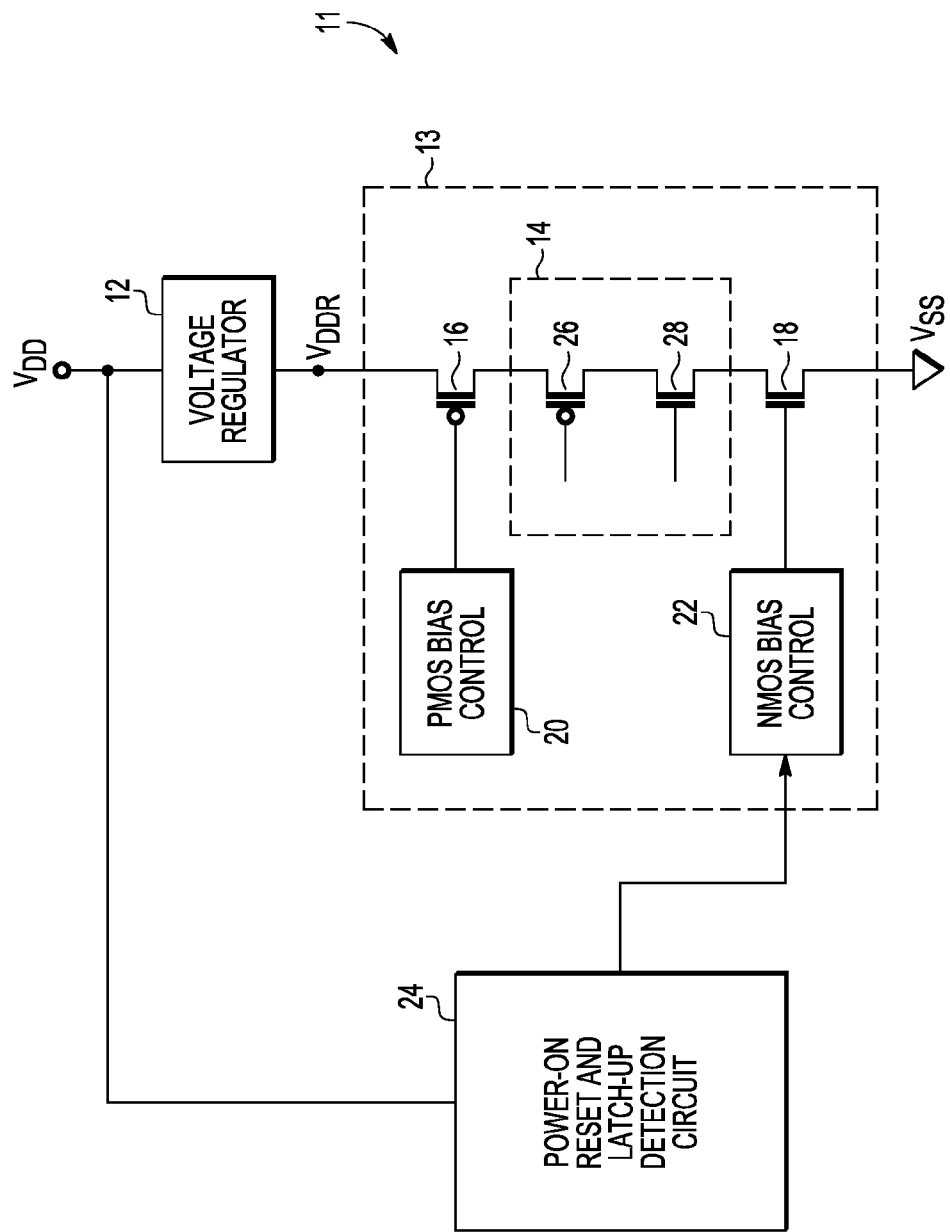
FIG. 2 illustrates, in partial block diagram form and partial schematic diagram form, a portion of the integrated circuit of FIG. 1 in accordance with an embodiment.

FIG. 2 illustrates, in partial block diagram form and partial schematic diagram form, a portion 11 of the integrated circuit 10 of FIG. 1 in accordance with an embodiment. FIG. 2 illustrates one embodiment of a circuit for removing the power supply voltage from a circuit susceptible to latch-up. As an example embodiment of a latch-up susceptible circuit, a portion of logic block 13 is illustrated in FIG. 2. In other embodiments, the latch-up susceptible circuit may be in any one or more of the circuit blocks including memory 17 and processor 15. In the illustrated embodiment, integrated circuit 10 is implemented using a conventional CMOS (complementary metal oxide semiconductor) integrated circuit manufacturing process. Integrated circuit 10 may be implemented differently in another embodiment.

Logic block 13 includes P-channel transistor 16, N-channel transistor 18, series-connected transistors 14, PMOS (P-type metal oxide semiconductor) bias control circuit 20, and NMOS (N-type metal oxide semiconductor) bias control circuit 22. Series-connected transistors 14 include P-channel transistor 26 and N-channel transistor 28 as an example of transistor susceptible to latch-up. In other embodiments, the transistor connections may be different. Series-connected transistors 14 may be part of a logic gate, for example, an inverter, or part of a memory cell. There may be many series-connected transistors 14 in integrated circuit 10. P-channel transistor 16 has a first current electrode (source) connected to a power supply voltage terminal for receiving power supply voltage VDDR, a second current electrode (drain), and a control electrode (gate) connected to an output terminal of PMOS bias control 20. P-channel transistor 26 has a first current electrode connected to the second current electrode of transistor 16, a second current electrode, and a control electrode. N-channel transistor 28 has a first current electrode connected to the second current electrode of transistor 26, a second current electrode, and a control electrode. The control electrodes of transistors 26 and 28 are for receiving control signals, or for receiving an output of one or more other logical operations. In one embodiment, the control electrodes of transistors 26 and 28 are connected together to form an inverter. N-channel transistor 18 has a first current electrode connected to the second current electrode of transistor 28, a second current electrode connected to a power supply voltage terminal labeled "VSS", and a control electrode connected to an output of NMOS bias control circuit 22. In one embodiment, power supply voltage VDD may be 3.0 volts and VSS may be connected to ground. In another embodiment, the power supply voltage may be different. Also, integrated circuit 10 may have more than one power supply voltage.

PMOS bias control circuit 20 and NMOS bias control circuit 22 function to control the gate voltages of transistors 16 and 18, respectively, depending on the operating mode of integrated circuit 10. NMOS bias control circuit 22 has an input connected to an output of POR and latch-up detection circuit 24. Note that bias control circuits 20 and 22 may receive control signals from other circuits that are not illustrated in FIG. 2. For example, during a normal operating mode, PMOS bias control circuit 20 provides a logic low voltage to the control gate of transistor 16 and NMOS bias control circuit 22 provides a logic high voltage to the control gate of transistor 18. Generally, transistors 16 and 18 function as switches and are both conductive during the normal operating mode, causing series-connected transistors 14 to receive power supply voltage VDDR. Also, in a low power mode, the bias voltage to the control electrode of N-channel transistor 18 may be controlled by NMOS bias control circuit 22 to cause the voltage at the first current electrode of transistor 18 to be elevated above ground by a predetermined amount. By way of example, if VDD is 3.0 volts, the voltage at the first current electrode of transistor 18 may be elevated to 0.4 volts above ground. Elevating VSS above ground reduces the power supply voltage, thus reducing power consumption.

If a latch-up condition occurs in series-connected transistors 14, a higher than normal current may flow between VDD and VSS. The higher than normal current may cause power supply voltage VDD to drop significantly. To prevent damage in integrated circuit 10, power-on reset and latch-up detection circuit 24 has an input connected to receive and monitor power supply voltage VDD. If the power supply voltage drops below a predetermined threshold voltage, the latch-up detection portion of circuit 24 initiates a power-on reset sequence in integrated circuit 10. Generally, a conventional POR sequence resets certain circuit blocks and registers of integrated circuit 10 to predetermined states, and holds the predetermined states until the power supply voltage has stabilized at the predetermined normal operating power supply voltage. In addition to the conventional POR sequence, POR and latch-up detection circuit 24 de-asserts the bias voltage to the control electrode of transistor 18 causing transistor 18 to become substantially non-conductive and thus decouple the current path used by the high destructive current during latch-up. In the illustrated embodiment, POR and latch-up detection circuit 24 monitors power supply voltage VDD, in another embodiment, power supply voltage VDDR may be monitored.

Figure 3:
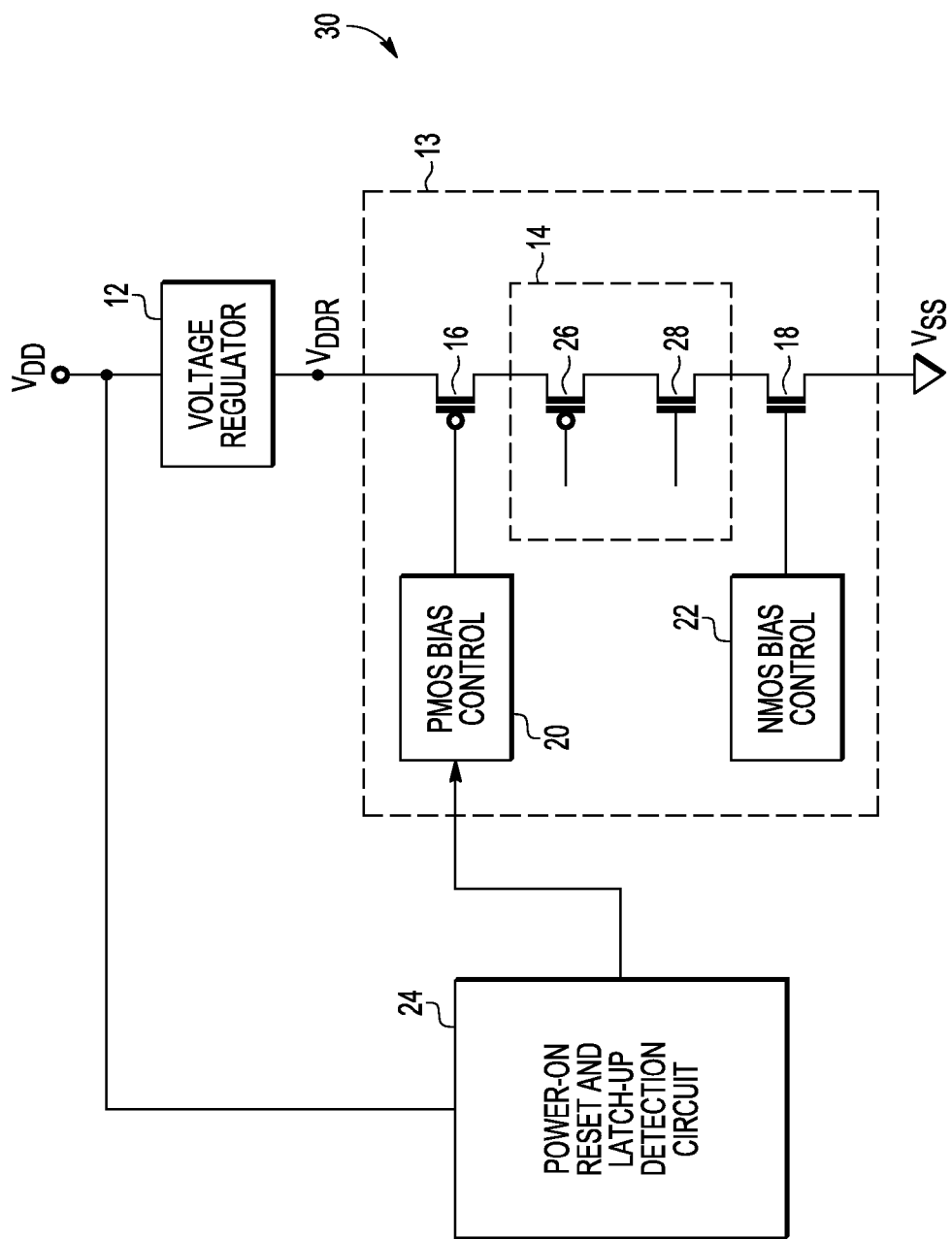
FIG. 3 illustrates, in partial block diagram form and partial schematic diagram form, a portion of the integrated circuit of FIG. 1 in accordance with another embodiment.

FIG. 3 illustrates, in partial block diagram form and partial schematic diagram form, a portion 30 of integrated circuit 10 in accordance with another embodiment. Portion 30 is substantially the same as portion 11 except that POR and latch-up detection circuit 24 has an output connected to an input of PMOS bias control circuit 20 instead of to an input of NMOS bias control circuit 22. When a latch-up condition is detected, POR and latch-up detection circuit 24 sends a signal to PMOS bias control circuit 20 to cause P-channel transistor 16 to turn off and thus become substantially non-conductive. The current path for the latch-up current is interrupted, thus preventing damage to integrated circuit 10.

Figure 4:
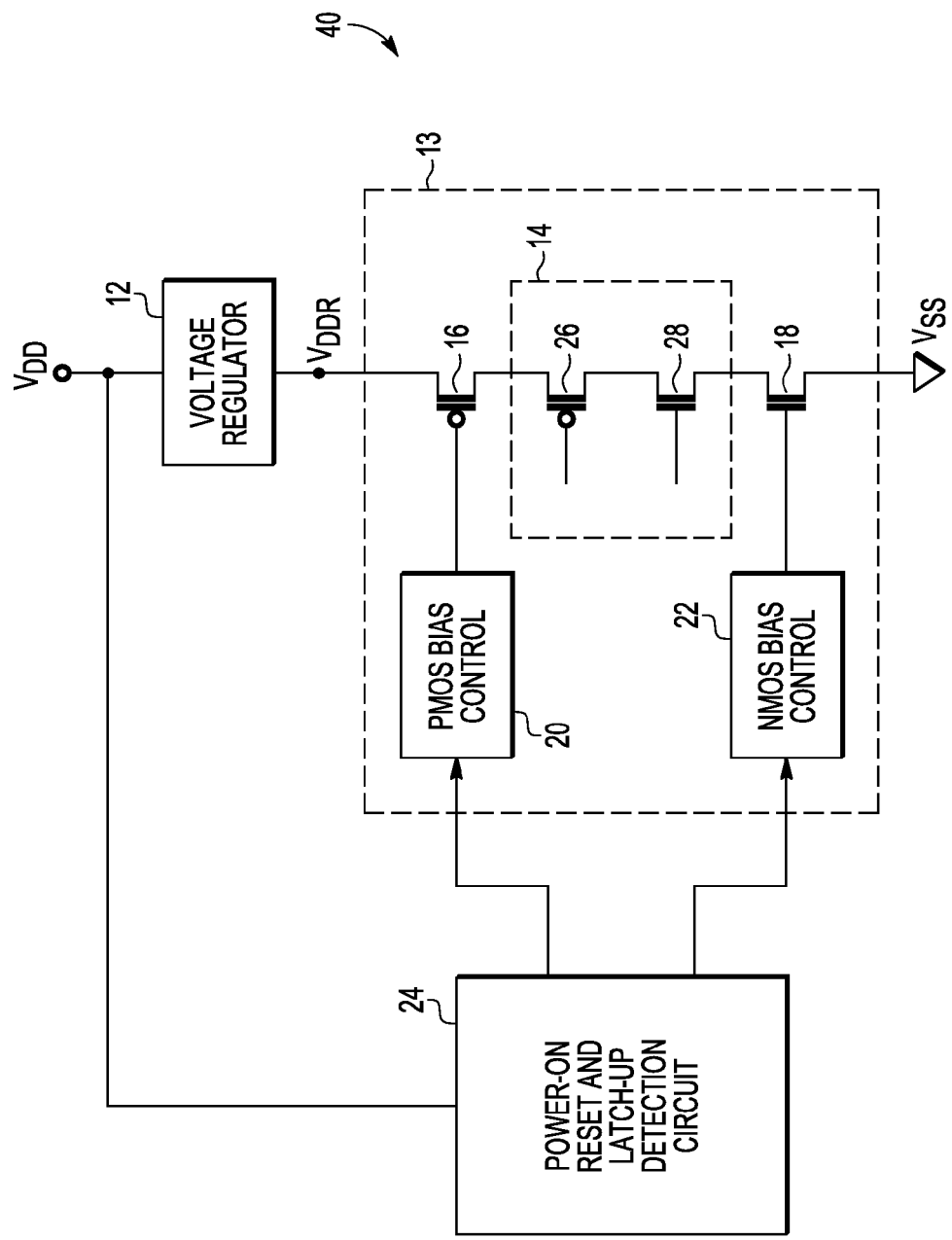
FIG. 4 illustrates, in partial block diagram form and partial schematic diagram form, a portion of the integrated circuit of FIG. 1 in accordance with yet another embodiment.

FIG. 4 illustrates, in partial block diagram form and partial schematic diagram form, a portion 40 of integrated circuit 10 in accordance with yet another embodiment. Portion 40 is substantially the same as portions 11 and 30 except that POR and latch-up detection circuit 24 has a first output connected to an input of PMOS bias control circuit 20 and a second output connected to an input of NMOS bias control circuit 22. When a latch-up condition is detected, POR and latch-up detection circuit 24 sends a first signal to PMOS bias control circuit 20 to cause P-channel transistor 16 to turn off, and sends a second signal to NMOS bias control circuit 22 to cause N-channel transistor 18 to turn off, thus interrupting current flow through series-connected transistors 14.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

Those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the invention is described herein with reference to specific embodiments, various modifications and changes can be made without departing from the scope of the present invention as set forth in the claims below. For example, even though the illustrated embodiment shows the POR circuit and the latch-up detection circuit in the same block, in another embodiment, they may be implemented as separate blocks. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling. Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. An integrated circuit comprising:
a first transistor having a first current electrode, a second current electrode, and a control electrode;
a second transistor having a first current electrode coupled to the second current electrode of the first transistor, a second current electrode, and a control electrode;
a switch for coupling the first and second transistors to receive a power supply voltage in response to an asserted bias control signal;
a voltage regulator having an input coupled to receive an externally generated power supply voltage, the voltage regulator having output terminal for providing the power supply voltage; and
a power-on reset circuit having a latch-up detection circuit coupled to receive the externally generated power supply voltage and to a control terminal of the switch, the latch-up detection circuit for detecting that the externally generated power supply voltage has dropped below a predetermined threshold voltage, and in response to detecting that the externally generated power supply voltage has dropped below the predetermined threshold voltage, deasserting the bias control signal to decouple the first and second transistors from the power supply voltage.

2. The integrated circuit of claim 1, wherein the first transistor is characterized as being a P-channel transistor, and the second transistor is characterized as being an N-channel transistor.

3. The integrated circuit of claim 1, wherein the first transistor and the second transistor are part of a logic circuit.

4. The integrated circuit of claim 1, wherein the switch comprises a third transistor having a first current electrode coupled to the second current electrode of the second transistor, a second current electrode coupled to a ground terminal, and a control electrode coupled to the power-on reset circuit.

5. The integrated circuit of claim 1, wherein the switch comprises a third transistor having a first current electrode coupled to receive the power supply voltage, a second current electrode coupled to the first current electrode of the first transistor, and a control electrode coupled to the power-on reset circuit.

6. An integrated circuit comprising:
a first transistor having a first current electrode, a second current electrode, and a control electrode;

a second transistor having a first current electrode coupled to the second current electrode of the first transistor, a second current electrode, and a control electrode;
a switch for coupling the first and second transistors to receive a power supply voltage in response to an asserted bias control signal, wherein the switch comprises a third transistor having a first current electrode coupled to the second current electrode of the second transistor, a second current electrode coupled to a ground terminal, and a control electrode coupled to the power-on reset circuit;
a power-on reset circuit having a latch-up detection circuit coupled to receive the power supply voltage and to a control terminal of the switch, the latch-up detection circuit for detecting a low voltage condition of the power supply voltage, and in response, deasserting the bias control signal to decouple the first and second transistors from the power supply voltage; and
a fourth transistor having a first current electrode coupled to receive the power supply voltage, a second current electrode coupled to the first current electrode of the first transistor, and a control electrode coupled to the power-on reset circuit.

7. An integrated circuit comprising:
a first transistor having a first current electrode, a second current electrode, and a control electrode;
a second transistor having a first current electrode coupled to the second current electrode of the first transistor, a second current electrode, and a control electrode;
a switch for coupling the first and second transistors to receive a power supply voltage in response to an asserted bias control signal;
a power-on reset circuit having a latch-up detection circuit coupled to receive the power supply voltage and to a control terminal of the switch, the latch-up detection circuit for detecting a low voltage condition of the power supply voltage, and in response, deasserting the bias control signal to decouple the first and second transistors from the power supply voltage; and
a voltage regulator having an input coupled to receive an externally generated power supply voltage, the voltage regulator having output terminal for providing the power supply voltage.

8. The integrated circuit of claim 1, wherein the first transistor and the second transistor are coupled together to form an inverter.

9. The integrated circuit of claim 1, wherein the low voltage condition comprises the externally generated power supply voltage dropping below a predetermined threshold voltage.

10. An integrated circuit comprising:
a first power supply voltage terminal;
a second power supply voltage terminal;
a first P-channel transistor having a first current electrode coupled to the first power supply voltage terminal, a second current electrode, and a control electrode;
a first N-channel transistor having a first current electrode coupled to the second current electrode of the first P-channel transistor, a second current electrode, and a control electrode;
a second N-channel transistor having a first current electrode coupled to the second current electrode of the first N-channel transistor, a second current electrode coupled to the second power supply voltage terminal, and a control electrode;
a first bias control circuit coupled to provide a first bias signal to the control electrode of the second N-channel transistor;
a latch-up detection circuit coupled to the first power supply voltage terminal for detecting when a power supply voltage provided to the first power supply voltage terminal drops below a predetermined threshold voltage; and
a power-on reset circuit coupled to the latch-up detection circuit and to an input terminal of the bias control circuit, the power-on reset circuit for causing the integrated circuit to initiate a power-on reset sequence and to cause the bias control circuit to make the second N-channel transistor substantially non-conductive.

11. The integrated circuit of claim 10, further comprising a voltage regulator having an input terminal coupled to the first power supply voltage terminal, and an output terminal coupled to the first current electrode of the first P-channel transistor.

12. The integrated circuit of claim 10, wherein the control electrodes of the first P-channel transistor and the first N-channel transistor are coupled together.

13. The integrated circuit of claim 10, further comprising a second P-channel transistor having a first current electrode coupled to the first power supply voltage terminal, a second current electrode coupled to the first current electrode of the first P-channel transistor, and a control electrode.

14. The integrated circuit of claim 13, further comprising a second bias control circuit coupled to provide a second bias signal to the control electrode of the second P-channel transistor, and an input terminal coupled to the power-on reset circuit.

15. The integrated circuit of claim 10, wherein the integrated circuit is characterized as being a data processing system.

16. In an integrated circuit, a method for preventing latch-up in first and second transistors coupled in series, the method comprising:
receiving and regulating an externally generated power supply voltage to provide a power supply voltage;
supplying the first and second transistors with the power supply voltage;
monitoring the externally generated power supply voltage to detect a low voltage condition caused by the latch-up in the first and second transistors;
detecting that the externally generated power supply voltage has dropped below a predetermined threshold voltage;
initiating a power-on reset (POR) operation in the integrated circuit in response to detecting that the externally generated power supply voltage has dropped below the predetermined threshold voltage;
decoupling the first and second transistors from the power supply voltage for a predetermined time period as part of the POR operation; and
re-supplying the power supply voltage to the first and second transistors following the predetermined time period.

17. The method of claim 16, wherein decoupling the first and second transistors from the power supply voltage further comprises turning off a first switch that is coupled between the first and second transistors and a first power supply voltage terminal.

18. In an integrated circuit, a method for preventing latch-up in first and second transistors coupled in series, the method comprising:
supplying the first and second transistors with a power supply voltage;
monitoring the power supply voltage to detect a low voltage condition caused by the latch-up in the first and second transistors;

detecting that the power supply voltage has dropped below a predetermined threshold voltage;

initiating a power-on reset (POR) operation in the integrated circuit in response to detecting that the power supply voltage has dropped below the predetermined threshold voltage;

decoupling the first and second transistors from the power supply voltage for a predetermined time period as part of the POR operation by turning off a first switch that is coupled between the first and second transistors and a first power supply voltage terminal, and turning off a second switch that is coupled between the first and second transistors and a second power supply voltage terminal; and re-supplying the power supply voltage to the first and second transistors following the predetermined time period.

19. The method of claim 18, wherein turning off the first switch further comprises removing a bias voltage from a control electrode of a transistor coupled between the first and second transistor and the first power supply voltage terminal.

20. The method of claim 18, wherein supplying the first and second transistors with a power supply voltage further comprises supplying the first and second transistors with a regulated power supply voltage.

* * * * *